(12) United States Patent
Takahashi et al.

(10) Patent No.: US 12,368,032 B2
(45) Date of Patent: **\*Jul. 22, 2025**

(54) GAS ANALYZER APPARATUS

(71) Applicant: ATONARP INC., Tokyo (JP)

(72) Inventors: Naoki Takahashi, Tokyo (JP); Prakash Sreedhar Murthy, Tokyo (JP)

(73) Assignee: ATONARP INC., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/442,177

(22) Filed: Feb. 15, 2024

(65) Prior Publication Data

US 2024/0266155 A1    Aug. 8, 2024

Related U.S. Application Data

(63) Continuation of application No. 18/065,656, filed on Dec. 14, 2022, now Pat. No. 11,942,312, which is a
(Continued)

(30) Foreign Application Priority Data

Mar. 25, 2019   (JP) ................................ 2019-057148

(51) Int. Cl.
*H01J 37/32*   (2006.01)
*H01J 49/10*   (2006.01)

(52) U.S. Cl.
CPC ...... *H01J 37/32981* (2013.01); *H01J 37/321* (2013.01); *H01J 37/32348* (2013.01);
(Continued)

(58) Field of Classification Search
None
See application file for complete search history.

(56) References Cited

U.S. PATENT DOCUMENTS 4,692,630 A  *  9/1987  Gogol ................... G01N 21/62
                                                            250/423 P
5,093,571 A  *  3/1992  Inomata .............. H01J 37/3244
                                                            250/288
(Continued)

FOREIGN PATENT DOCUMENTS

CN          109243964 A       1/2019
JP          H09265937 A      10/1997
(Continued)

OTHER PUBLICATIONS

Office Action (Notice of Reasons for Refusal) issued on Jul. 31, 2024, by the Japanese Patent Office in corresponding Japanese Patent Application No. 2024-012522, and an English Translation of the Office Action. (21 pages).
(Continued)

*Primary Examiner* — Srinivas Sathiraju
(74) *Attorney, Agent, or Firm* — Buchanan Ingersoll & Rooney PC

(57) ABSTRACT

There is provided a gas analyzer apparatus including: a sample chamber which is equipped with a dielectric wall structure and into which only sample gas to be measured is introduced; a plasma generation mechanism that generates plasma inside the sample chamber, which has been depressurized, using an electric field and/or a magnetic field applied through the dielectric wall structure; and an analyzer unit that analyzes the sample gas via the generated plasma. By doing so, it is possible to provide a gas analyzer apparatus capable of accurately analyzing sample gases, even those including corrosive gas, over a long period of time.

9 Claims, 4 Drawing Sheets

Related U.S. Application Data continuation of application No. 17/417,581, filed as application No. PCT/JP2020/012839 on Mar. 24, 2020, now Pat. No. 11,557,469.

(52) U.S. Cl.
 CPC .. *H01J 37/32449* (2013.01); *H01J 37/32963* (2013.01); *H01J 49/105* (2013.01); *H01J 2237/057* (2013.01); *H01J 2237/332* (2013.01); *H01J 2237/334* (2013.01); *H01J 2237/335* (2013.01)

(56) References Cited

U.S. PATENT DOCUMENTS

| | | | | |
|---|---|---|---|---|
| 5,342,580 | A * | 8/1994 | Brenner | G01N 13/00 436/147 |
| 5,641,546 | A * | 6/1997 | Elwell | H01J 37/32678 427/571 |
| 6,534,007 | B1 * | 3/2003 | Blonigan | H01J 37/32963 422/62 |
| 6,748,334 | B1 * | 6/2004 | Perez | G01N 33/0016 702/24 |
| 6,881,276 | B2 * | 4/2005 | Blonigan | C23C 14/564 134/1.1 |
| 7,153,709 | B1 * | 12/2006 | Purdy | H01L 21/67288 438/4 |
| 7,329,863 | B2 * | 2/2008 | Kalinitchenko | H01J 49/105 250/281 |
| 7,621,171 | B2 * | 11/2009 | O'Brien | G01N 30/32 73/23.41 |
| 7,820,981 | B2 * | 10/2010 | Horsky | H01J 9/38 315/111.21 |
| 7,878,145 | B2 * | 2/2011 | Fang | H01J 37/32412 118/712 |
| 8,368,013 | B2 * | 2/2013 | Ishimaru | H01J 49/145 250/281 |
| 8,525,111 | B1 * | 9/2013 | Brown | H01J 49/24 250/281 |
| 8,816,272 | B1 * | 8/2014 | Brown | H01J 49/24 250/282 |
| 8,921,774 | B1 * | 12/2014 | Brown | H01J 49/24 250/282 |
| 9,093,253 | B2 * | 7/2015 | Bartfay-Szabo | H01J 49/0022 |
| 9,099,286 | B2 * | 8/2015 | Brown | H01J 49/0031 |
| 9,543,135 | B2 * | 1/2017 | Kumano | H01J 49/0431 |
| 9,645,285 | B2 | 5/2017 | Cadet et al. | |
| 9,831,353 | B2 * | 11/2017 | Kawata | H01L 21/02639 |
| 9,859,117 | B2 * | 1/2018 | Yamazaki | C23C 14/3414 |
| 9,997,325 | B2 * | 6/2018 | Hosch | H01J 37/32935 |
| 10,032,872 | B2 * | 7/2018 | Yamazaki | C23C 14/35 |
| 10,204,775 | B2 * | 2/2019 | Brown | H01J 49/0095 |
| 10,319,575 | B2 * | 6/2019 | Brown | G01N 27/622 |
| 10,446,453 | B2 * | 10/2019 | Coppa | H01J 37/32935 |
| 10,641,927 | B2 | 5/2020 | Sonoda et al. | |
| 10,746,713 | B2 * | 8/2020 | Graupmann | B08B 9/027 |
| 10,777,401 | B2 * | 9/2020 | Wolf | H05H 1/2406 |
| 11,201,045 | B2 * | 12/2021 | Wolf | H01J 37/32348 |
| 11,335,575 | B2 * | 5/2022 | Rinzan | G01N 29/036 |
| 11,430,643 | B2 * | 8/2022 | Zhao | H01J 37/32981 |
| 11,557,469 | B2 * | 1/2023 | Takahashi | H01J 37/32963 |
| 11,646,175 | B2 * | 5/2023 | DeLuca | H01J 37/244 250/492.21 |
| 11,929,270 | B2 * | 3/2024 | Rinzan | H01L 21/67253 |
| 11,942,312 | B2 * | 3/2024 | Takahashi | H01J 37/321 |
| 2002/0066535 | A1 * | 6/2002 | Brown | H01L 21/67017 118/712 |
| 2003/0046976 | A1 * | 3/2003 | Hanazaki | G01N 21/68 118/723 R |
| 2003/0082891 | A1 * | 5/2003 | Walther | H01J 37/3171 257/E21.336 |
| 2003/0098419 | A1 * | 5/2003 | Ji | G01N 21/33 250/373 |
| 2003/0159711 | A1 * | 8/2003 | Blonigan | H01J 37/32963 134/1.2 |
| 2004/0035183 | A1 * | 2/2004 | O'Brien | G01N 1/2202 73/431 |
| 2004/0179187 | A1 * | 9/2004 | Mettes | G01N 21/68 356/316 |
| 2005/0269506 | A1 * | 12/2005 | Kalinitchenko | H01J 49/067 250/288 |
| 2006/0144126 | A1 * | 7/2006 | O'Brien | G01N 21/51 73/28.01 |
| 2008/0026133 | A1 * | 1/2008 | Fang | H01J 37/32412 118/712 |
| 2008/0209807 | A1 * | 9/2008 | Tsangaris | C10J 3/82 48/89 |
| 2008/0223409 | A1 * | 9/2008 | Horsky | H01J 37/304 134/166 R |
| 2010/0084549 | A1 * | 4/2010 | Ermakov | H01J 49/4245 250/293 |
| 2011/0253889 | A1 * | 10/2011 | Ishimaru | H01J 49/145 250/288 |
| 2013/0048851 | A1 * | 2/2013 | Kumano | H01J 49/0431 250/288 |
| 2013/0269252 | A1 * | 10/2013 | Tsangaris | C10K 1/16 48/209 |
| 2014/0299577 | A1 * | 10/2014 | Chung | H01J 37/32981 118/712 |
| 2017/0016868 | A1 * | 1/2017 | Kim | G01N 33/0039 |
| 2017/0050223 | A1 * | 2/2017 | Graupmann | H01J 37/32862 |
| 2019/0094194 | A1 * | 3/2019 | Graupmann | G01N 33/0009 |
| 2020/0176291 | A1 * | 6/2020 | Rinzan | C23C 16/45525 |
| 2021/0005435 | A1 * | 1/2021 | Jung | H01J 37/32477 |
| 2021/0351027 | A1 * | 11/2021 | Lin | H01J 49/26 |
| 2022/0044919 | A1 * | 2/2022 | Takahashi | H01J 37/32981 |
| 2022/0285184 | A1 * | 9/2022 | Rinzan | C23C 16/4412 |
| 2023/0038880 | A1 * | 2/2023 | Ganany | H01J 37/32935 |
| 2023/0187190 | A1 * | 6/2023 | Takahashi | H01J 37/32348 315/111.21 |
| 2024/0266155 | A1 * | 8/2024 | Takahashi | H01J 37/32348 |

FOREIGN PATENT DOCUMENTS

| | | |
|---|---|---|
| JP | 2005535071 A | 11/2005 |
| JP | 2013134817 A | 7/2013 |
| JP | 2014521123 A | 8/2014 |
| JP | 2015510683 A | 4/2015 |
| JP | 2016027327 A | 2/2016 |
| JP | 2017107816 A | 6/2017 |
| JP | 2017222562 A | 12/2017 |
| KR | 20080112266 A | 12/2008 |
| KR | 20140116893 A | 10/2014 |
| WO | 2018179825 A1 | 10/2018 |

OTHER PUBLICATIONS

International Preliminary Report on Patentability and Written Opinion of the International Searching Authority (Forms PCT/IB/373 and PCT/ISA/237) issued on Sep. 28, 2021, by the International Bureau of WIPO in corresponding International Application No. PCT/JP2020/012839, 5 pages.

International Search Report (PCT/ISA/210) with translation and Written Opinion (PCT/ISA/237) mailed on Jun. 16, 2020, by the Japanese Patent Office as the International Searching Authority for International Application No. PCT/JP2020/012839.

Office Action (Notification of Reason for Refusal) issued on Oct. 22, 2021, by the Korean Patent Office in corresponding Korean Patent Application No. 10-2021-7023565, 12 pages including 7 pages of English Translation.

Office Action issued in corresponding Chinese Patent Application No. 202080024324.2, dated Jan. 7, 2022, 7 pages including 1 page of English Translation of the Search Report.

* cited by examiner

GAS ANALYZER APPARATUS

CROSS-REFERENCE TO RELATED APPLICATIONS

The present application is a continuation of U.S. patent application Ser. No. 18/065,656, which was filed on Dec. 14, 2022, which is a continuation of U.S. patent application Ser. No. 17/417,581, which was filed on Jun. 23, 2021, and which is a 371 of International Application No. PCT/JP2020/012839, filed on Mar. 24, 2020, and which claims priority of JP 2019-057148, which was filed on Mar. 25, 2019.

TECHNICAL FIELD

The present invention relates to a gas analyzer apparatus.

BACKGROUND ART

Japanese Laid-open Patent Publication No. 2017-107816 discloses a technology relating to the provision of a filament for emitting thermions with a long working life, which improves the analysis accuracy of a mass spectrometer that uses such filament for emitting thermions. The cited reference discloses a filament for emitting thermions equipped with a core material through which an electric current flows and an electron emitting layer formed so as to cover the surface of the core material, where the electron emitting layer is sufficiently dense to effectively shut out gases.

In Japanese Laid-open Patent Publication No. 2016-27327, the sample holder in a glow discharge optical emission spectrometry (GD-OES) is provided with an electrode (second electrode) that has a sample fixing surface and an outer cylinder portion and an inner cylinder portion (contact portions) inside which the sample fixing surface is disposed. In a state where the sample has been moved away from the opening of a glow discharge tube, the open end of the inner cylinder portion is placed in contact with the peripheral edge of the opening. The inside of the glow discharge tube, the outer cylinder portion, and the inner cylinder portion that have become connected is depressurized, and then argon gas is supplied. After this, the inner cylinder portion is moved relative to the outer cylinder portion to bring the sample closer to the tip of the cylindrical portion (end portion) of the anode (first electrode) of the glow discharge tube, a refrigerant is caused to flow on a flow path (cooled portion) to cool the sample, and a voltage is applied to the electrodes so that analysis can be performed of the light emitted by glow discharge.

SUMMARY OF INVENTION

There is demand for a gas analyzer apparatus that has a longer working life and can accurately analyze sample gases, including those containing corrosive gases, over a long period of time.

One aspect of the present invention is a gas analyzer apparatus including: a sample chamber which is equipped with a dielectric wall structure and into which only a sample gas to be measured is introduced; a plasma generation mechanism that generates plasma in the sample chamber, which has been depressurized, using an electric field and/or a magnetic field applied through the dielectric wall structure; and an analyzer unit that analyzes the sample gas via the generated plasma. In this gas analyzer apparatus, since plasma is generated in the sample chamber into which only the sample gas to be measured (measurement target) is introduced, it is possible to generate plasma without using a gas aside from the sample gas, such as argon gas for glow discharge or argon gas for generating a plasma torch. Accordingly, by analyzing the sample gas with the analysis unit using the generated plasma, it is possible to measure the components contained in the sample gas quantitatively and with higher accuracy.

In addition, by generating plasma in the sample chamber using an electric field and/or a magnetic field applied through the dielectric wall structure, parts with low resistance to corrosion, such as cathodes for glow discharge and filaments for thermionic discharge can be omitted. This means that it is possible to provide a gas analyzer apparatus capable of accurately analyzing sample gases, even those containing corrosive gas, over a long period of time.

The gas analyzer apparatus may further include a gas input unit configured to introduce or flow only the sample gas from a process into the sample chamber. Sample gas from a process, and in particular processes such as etching and film forming that include a plasma process, facilitates generation of plasma without an assist gas such as argon gas, and is one example of an application to which this gas analyzer apparatus is suited.

The dielectric wall structure (dielectric wall) may include at least one of quartz, aluminum oxide ($Al_2O_3$), and silicon nitride ($SiN_3$). The plasma generation mechanism may include a mechanism for generating plasma using at least one of inductively coupled plasma (ICP), dielectric barrier discharge (DBD), and electron cyclotron resonance (ECR).

The sample chamber may be a small or miniature chamber. Plasma for measurement purposes can be stably generated in a small chamber that is separate to the large processing chamber. As one example, the sample chamber may have a total length of 1 to 100 mm and a diameter of 1 to 100 mm. Alternatively, the total length and diameter may be 5 mm or larger or 10 mm or larger, and 80 mm or smaller, 50 mm or smaller, or 30 mm or smaller. The volume of the sample chamber may be 1 $mm^3$ or larger and $10^5$ $mm^3$ or smaller. Alternatively, the volume of the sample chamber 11 may be 10 $mm^3$ or larger or 30 $mm^3$ or larger, or 100 $mm^3$ or larger. The volume of the sample chamber may be $10^4$ $mm^3$ or smaller, or $10^3$ $mm^3$ or smaller.

The analyzer unit may be a light-emitting analyzer unit that optically detects the light emitted by plasma generated in the sample chamber. The light-emitting analyzer unit may include an optical spectrometer (optical emission spectrometer). The analyzer unit may include: a filter unit that filters ionized gas present in the plasma; and a detector unit that detects ions that have been filtered. The gas analyzer apparatus may further include an energy filter disposed between the filter unit and the sample chamber.

Another aspect of the present invention is a process monitoring apparatus that includes the gas analyzer apparatus described above. This monitoring apparatus includes a sample chamber that differs to a processing chamber and can generate plasma in the sample chamber that is independent of the process plasma generated in the processing chamber. Accordingly, unlike a conventional process monitor (plasma process monitor) that measures the process plasma generated in the process chamber, plasma is generated under conditions suited to gas analysis, which makes it possible to accurately monitor the state of the gas in the process chamber.

Yet another aspect of the present invention is a system including: the gas analyzer apparatus described above; and a processing chamber in which a plasma process is carried out and from which sample gas is supplied to the gas analyzer apparatus. The plasma process can be accurately monitored over a long period of time by the gas analyzer apparatus that is highly resistant to corrosive gas and generates plasma without using a support gas such as argon gas. The system may include a process monitoring apparatus.

The system may further include a process control unit that controls at least one plasma process carried out in the processing chamber based on a measurement result provided by the gas analyzer apparatus. The process control unit may include a unit that determines an endpoint of the at least one plasma process from a measurement result provided by the gas analyzer apparatus for a by-product of the at least one plasma process.

Yet another aspect of the present invention is a control method of a system that includes a processing chamber that carries out a plasma process. The system further includes a gas analyzer apparatus including a sample chamber which differs to the processing chamber and into which only a sample gas from the processing chamber is introduced. This method that monitors the plasma formed in the processing chamber includes controlling the plasma process carried out in the processing chamber based on a measurement result of the gas analyzer apparatus. The controlling of the plasma process may include determining an endpoint of at least one plasma process from the measurement result provided by the gas analyzer apparatus for a by-product of the at least one plasma process. The at least one plasma process may include at least one of etching, film forming, and cleaning.

In this control method, the gas analyzer apparatus may measure ions produced by ionization using thermions inside the sample chamber. This control method may include generating plasma in the sample chamber independently of the processing chamber. By doing so, the state inside the processing chamber can be monitored more continuously and accurately, which makes more stable control possible.

Yet another aspect of the present invention is a program that controls a system including a processing chamber that carries out a plasma process. The program includes instructions that control the plasma process carried out in the processing chamber based on a measurement result provided by the gas analyzer apparatus. The program may further include instructions that generate plasma in a sample chamber independently of the processing chamber. A program or program product may be supplied having been recorded on a suitable recording medium.

DESCRIPTION OF EMBODIMENTS

One embodiment of the present invention is a gas analyzer apparatus, one example of which is a mass spectrometer apparatus. For applications in circumstances where corrosive gases are used, such as monitoring a manufacturing process for semiconductors, a sensor with high resistibility to corrosion is required.

Figure 1:
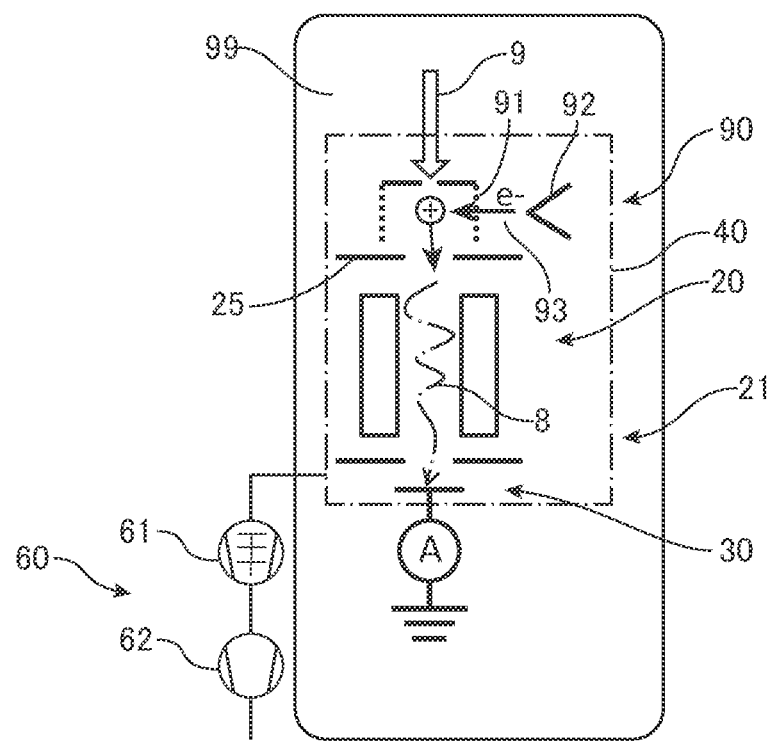
FIG. 1 is a block diagram depicting one example of a gas analyzer apparatus.

As one example of a gas analyzer apparatus, an overview of a quadrupole mass spectrometer will now be described with reference to FIG. 1. A quadrupole mass spectrometer (mass spectrometer apparatus, mass spectrometer) 99 includes an ionizer apparatus (ionizer unit, ionizer or ion source) 90 that ionizes a gas (gas sample or sample gas) 9 to be analyzed and an analyzer unit (gas analyzer section) 21 that analyzes the ionized gas 8. The gas analyzer unit 21 includes a quadrupole portion, which is a filter unit 20, and a detector unit (detection unit, for example, a Faraday cup) 30 that collects arriving gas ions 8 that have passed between the electrodes of the quadrupole. The quadrupole portion of the filter unit 20 includes a plurality, typically four, of columnar electrodes that are disposed at predetermined intervals in the circumferential direction and extend in the vertical direction. The mass spectrometer apparatus 99 includes a vacuum vessel (housing) 40 that houses the ionizer apparatus 90 and the gas analyzer unit 21. The gas 9 that has flowed into the housing 40 is ionized by the ionizer apparatus 90. The gas analyzer apparatus 99 includes an exhaust system 60 that keeps the housing 40 at negative pressure (that is, a vacuum). The exhaust system 60 may include a turbomolecular pump (TMP) 61 and a Roots pump (RP) 62 as vacuum pumps.

The ionizer apparatus 90 includes a grid 91 and a filament 92 that functions as a cathode for supplying thermions (that is, an electron flow) 93. One example of the grid 91 is constructed by arranging thin metal wires into a grid that is cylindrically shaped. The filament 92 is connected to metal support pins installed at predetermined intervals in the circumferential direction on a support frame, and is disposed on the outer circumference of the grid 91. One example of the filament 92 is produced by coating the surface of a base material made of iridium with yttrium oxide by performing an electrodeposition treatment. A focusing electrode 25 is interposed between the filter unit 20 and the ionizer apparatus 90 so that ions that are headed toward the quadrupole portion efficiently converge. As one example, the focusing electrode 25 is electrically connected to the support pins of the filament 92 so that the potential of the filament 92 and the potential of the focusing electrode 25 become equal.

A conventional mass spectrometer apparatus 99 is designed so as to operate with a condition of a pure gas environment, that is, an environment without corrosive gas. One example of a cathode material (filament material) suited to this condition is a $Y_2O_3$/Ir filament, where the core material is made of iridium Ir and the electron emitting layer is made of yttrium oxide (yttria, $Y_2O_3$). With this filament 92, the yttrium Y in the $Y_2O_3$ reacts with fluorine F or a fluorine-based gas to become yttrium fluoride $YF_3$ or yttrium oxyfluoride YOF, which are easy to evaporate. For gases that contain fluorocarbons CFx as components, tungsten W materials are believed to be effective as a filament material (cathode material). However, tungsten W does not have a sufficient working life in a gas or environments such as carbon tetrachloride $CCl_4$, hydrochloric acid HCl, tungsten fluoride $WF_6$, and tungsten chloride $WCl_6$.

Also, in an environment containing silicon oil, the filament 92 may become coated with Si, $SiO_2$, SiN or the like, especially when the mass spectrometer apparatus 99 is started or stopped, which results in impaired functioning. Although it is possible to perform cleaning with a corrosive gas containing methane fluoride $CF_4$, nitrogen trifluoride $NF_3$, or the like, this may further shorten the working life of the filament 92.

Inconel 600 is often used as the grid 91. Part of the gas may become deposited on the grid 91 to form an insulating film, and due to this the correct potential distribution may not be created in the ionizer/ion optical region.

At present, electron impact ionization is most commonly used as the ionization method of a mass spectrometer apparatus 99. This method requires a thermal filament 92 as an electron emitter, and there is the possibility of the filament 92 reacting with the sample gas 9 or its by-products. In addition, since the filament 92 also heats parts in the periphery, this may increase the rates of chemical reactions. It is possible to consider using a plasma ion source that does not have a heated part. However, it would be necessary to introduce a support gas, such as argon gas, to generate a plasma torch that serves as the plasma source, and this gas ends up being subjected to gas analysis together with the sample gas 9. When thermions are used for plasma generation, as with glow discharge, a filament (cathode) is required, and in the same way as with ionization using thermions, there is the problem of resistance to corrosion. In addition, evaporants from the filament and chemical reactants may also end up being subjected to gas analysis.

Figure 2:
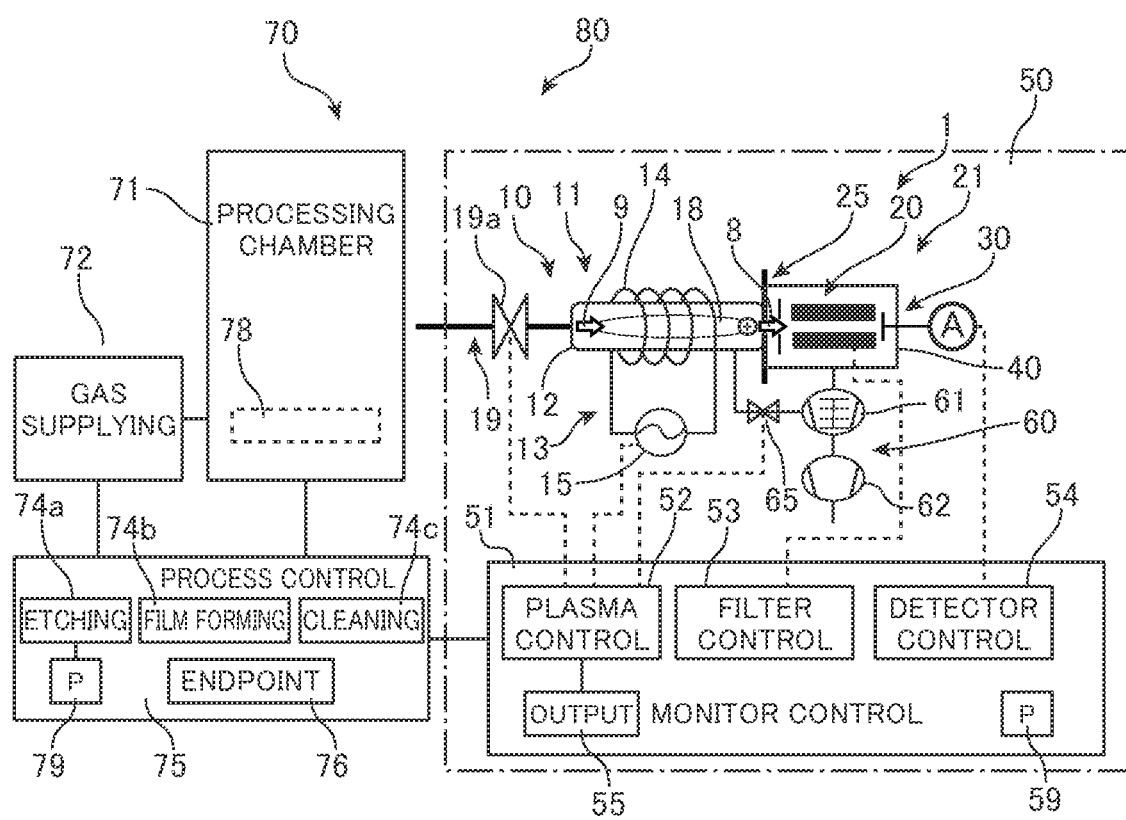
FIG. 2 is a diagram depicting one example of a system including a gas analyzer apparatus that performs plasma ionization.

FIG. 2 depicts one embodiment of the present invention. The system 80 depicted in FIG. 2 includes a processing apparatus 70, which includes a processing chamber 71 where one or more plasma processes are carried out, and a process monitoring apparatus (process monitor) 50 for monitoring each process carried out in the processing chamber 71. The processing apparatus 70 is an apparatus used for manufacturing and/or processing various products in industries that perform processing and manufacturing, including the chemical industry. The processing apparatus 70 in the present embodiment includes an apparatus for manufacturing or processing a product using plasma process, and is typically an apparatus that carries out the process of forming various types of films or layers on a substrate 78 and/or a process of etching the substrate 78. Examples of the processing apparatus 70 include a system that performs CVD (Chemical Vapor Deposition) or PVD (Physical Vapor Deposition). Another example of the processing apparatus 70 is an apparatus for carrying out a process with a semiconductor as a substrate 78. A different example of the processing apparatus 70 is an apparatus that carries out a process of forming various types of thin films on optical components such as lenses and filters as the substrate 78. However, the processing apparatus 70 is not limited to these examples.

The processing apparatus 70 includes a chamber (processing chamber) 71 in which the substrate to be processed is placed, a gas supplying apparatus 72 that supplies gas used for processing (processing gas) to the processing chamber 71, and a process control unit 75 including a function that controls the generation of plasma (processing plasma) for depositing (forming) a film and/or etching inside the processing chamber 71. The process control unit 75 may further include a function for performing control to generate cleaning plasma for cleaning the inside of the processing chamber 71.

The process monitor 50 includes a gas analyzer apparatus (gas analyzer) 1, which analyzes the gas (sample gas) 9 supplied from the processing chamber 71, and a monitor control unit 51, which controls the gas analyzer apparatus 1 and monitors the internal state of the processing chamber 71. The gas analyzer apparatus 1 includes a plasma generation unit (plasma generator) 10, which generates plasma 18 of the sample gas 9 to be measured (measurement target) that is supplied from the processing apparatus 70, and an analyzer unit 21, which analyzes the sample gas 9 via the generated plasma 18. The plasma generation unit 10 includes a chamber (sample chamber) 11, which is provided with a dielectric wall structure 12 and into which only the sample gas 9 to be measured is introduced, and a plasma generation mechanism 13 that generates plasma 18 in the sample chamber 11, which has been depressed (decompressed), using an electric field and/or a magnetic field applied via the dielectric wall structure 12.

The gas analyzer apparatus 1 according to the present embodiment is a mass spectrometer and the analyzer unit 21 includes a filter unit (in the present embodiment, the quadrupole portion) 20 that filters the ionized sample gas (sample gas ions) 8 generated as the plasma 18 by the plasma generation apparatus 10 according to the mass-to-charge ratio, a focus electrode 25 that draws some of the plasma 18 as an ion flow 8, a detector unit 30 that detects the ions that have been filtered, and a vacuum vessel (housing) 40 that houses the analyzer unit 21. The gas analyzer apparatus 1 includes an exhaust system 60 that keeps the inside of the housing 40 under an appropriate negative pressure condition (vacuum condition). The exhaust system 60 according to the present embodiment includes a turbo molecular pump (TMP) 61 and a Roots pump 62. The exhaust system 60 also controls the internal pressure of the sample chamber 11 of the plasma generation apparatus 10.

The gas analyzer apparatus 1 further includes a gas input unit 19 configured so that only the sample gas 9 from the processing apparatus 70 flows into the sample chamber 11 of the plasma generation unit 10. Into the sample chamber 11 that has been decompressed by the exhaust system 60, only the sample gas 9 from the processing apparatus 70 is introduced or flowed to form the plasma 18 in the sample chamber 11. That is, in the plasma generation unit 10, the plasma 18 to be used for analysis is generated using only the sample gas 9 without using an assist gas (support gas), such as argon gas. The walls 12 of the sample chamber 11 are constructed of a dielectric member (dielectric substance). Examples of dielectrics that are highly durable against plasma include quartz, aluminum oxide ($Al_2O_3$) and silicon nitride ($SiN_3$).

The plasma generation mechanism 13 of the plasma generation unit 10 generates the plasma 18 inside the sample chamber 11 using an electric field and/or a magnetic field applied via a dielectric wall structure 12 without using electrodes and without using a plasma torch. An example of the plasma generation mechanism 13 is a mechanism that excites the plasma 18 with high frequency (Radio Frequency or "RF") power. Examples of RF plasma include methods such as inductively coupled plasma (ICP), dielectric barrier discharge (DBD), and electron cyclotron resonance (ECR). A plasma generation mechanism 13 for these methods includes a high-frequency power supply 15 and a coil 14 disposed around the sample chamber 11.

The internal pressure of the sample chamber (vessel) 11 is controlled to become an appropriate negative pressure using the exhaust system 60 that is shared with the gas analyzer apparatus 1, a separate exhaust system, or an exhaust system that is shared with the processing apparatus 70. The internal pressure of the sample chamber 11 may be a pressure that facilitates the generation of plasma, for example, a pressure in a range of 0.01 to 1 kPa. When the internal pressure of the processing chamber 71 is controlled to become around one to several hundred Pa, the internal pressure of the sample chamber 11 may be controlled to become a lower pressure, for example, about 0.1 to several tens of Pa, or alternatively kept at 0.1 Pa or higher (or 0.5 Pa or higher) and 10 Pa or lower (or 5 Pa or lower). As one example, the inside of the sample chamber 11 may be depressurized to about 1 to 10 mTorr (0.13 to 1.3 Pa). By keeping the sample chamber 11 at the level of depressurization (decompression) described above, it is possible to generate the plasma 18 at a low temperature with only the sample gas 9.

For the process monitor 50, the substance to be monitored is the sample gas 9 supplied from the processing chamber 71 where a plasma process is carried out. This means that inside the sample chamber 11, the plasma 18 can be maintained by merely introducing the sample gas 9 through the supplying of RF power under appropriate conditions, without using arc discharge or a plasma torch. A magnetic field and an electric field may be used together to generate and confine the plasma 18 inside the chamber 11. By ionizing the sample gas 9 through the generation of plasma without requiring electrodes that would be depleted, it is possible to solve the problem of reduced working life due to the depletion of electrodes, and in turn to provide a gas analyzer apparatus 1 that has a longer measurement life and is capable of stabilized measurement.

In addition, by eliminating the need for a support gas such as argon gas, it is possible to generate ionized plasma 18 with only the sample gas 9 and to supply such plasma to the gas analyzer unit 21. This makes it possible to provide the gas analyzer apparatus 1 that has high measurement accuracy for the sample gas 9 and is capable of not only identifying gas components but also measuring the respective quantities of the components. This means that with a process monitor (process monitoring apparatus) 50 equipped with the gas analyzer apparatus 1, the internal state of the processing chamber 71 of the processing apparatus 70 can be stably and accurately monitored over a long period of time.

Also, in the process monitor 50, the plasma 18 of the sample gas 9 can be generated by the sample chamber 11 that is dedicated to gas analysis and is independent of the processing chamber 71. Accordingly, the plasma 18 can be generated in the sample chamber 11 under conditions that differ to the conditions in the processing chamber 71 and are suited to sampling and analysis of gases. This means that it is possible to monitor the internal state of the processing chamber 71 via the sample gas 9 even when process plasma or cleaning plasma is not being generated in the processing chamber 71.

The sample chamber 11 may be a small chamber (miniature chamber) of a sufficient size to generate the plasma 18, for example, several mm to several tens of mm. By making the capacity of the sample chamber 11 smaller, a gas analyzer apparatus 1 that has superior real-time performance can be provided. Even when a light-emitting analyzer unit equipped with an optical spectrometer (optical emission spectrometer) is used as the gas analyzer unit 21, it is possible to perform gas analysis by keeping the thickness of the plasma 18 at several mm to several tens of mm.

The total length of the sample chamber 11 may be 1 to 100 mm and the diameter may be 1 to 100 mm. Alternatively, the total length and diameter of the sample chamber 11 may be 5 mm or larger or 10 mm or larger, and 80 mm or smaller, 50 mm or smaller, or 30 mm or smaller. The volume of the sample chamber 11 may be 1 $mm^3$ or larger and $10^5$ $mm^3$ or smaller. Alternatively, the volume of the sample chamber 11 may be 10 $mm^3$ or larger or 30 $mm^3$ or larger, or 100 $mm^3$ or larger. The volume of the sample chamber 11 may be $10^4$ $mm^3$ or smaller, or $10^3$ $mm^3$ or smaller.

The monitor control unit 51 of the process monitor 50 includes a plasma control unit (plasma controller, plasma control function) 52 that controls the plasma generation unit 10, a filter control unit (filter controller, filter control function) 53 that controls the filter unit 20, and a detector control unit (detector controller, detector control function) 54 that controls the detector unit 30. The monitor control unit 51 may be provided with computer resources including memory and a CPU, and the functions of the monitor control unit 51 may be provided by a program 59. The program (program product) 59 may be provided having been recorded on a suitable recording medium.

The plasma control unit 52 may be provided with a function of controlling the frequency, voltage, and the like of the high-frequency power supply 15 for generating the plasma 18 in the sample chamber 11, a function of controlling the introducing amount (flow) of the sample gas 9 using a flow control valve 19a provided in the gas input unit 19, and a function of controlling the internal pressure of the sample chamber 11 using a pressure control valve 65 provided on a connection line that connects to the exhaust system 60. By controlling these factors, the plasma 18 can be stably generated inside the sample chamber 11 even when the type of process carried out in the processing chamber 71 changes and/or the state of a process changes, which makes it possible to continuously analyze and monitor the sample gas 9 from the processing apparatus 70.

The analyzer unit 21 of the present embodiment is a mass spectrometer, and in particular a quadrupole mass spectrometer, and the filter unit 20 is a quadrupole filter. For this reason, the filter control unit 53 includes a function as a driving unit (RF/DC unit) that applies high frequencies and direct current to the quadrupole. The filter unit 20 filters the ionized sample gas 8 according to mass-to-charge ratio.

The detector control unit 54 detects the components included in the sample gas 9 by capturing an ion current which is generated in the detector unit (detection unit or collector unit) 30, as one example, a Faraday cup, by the ions that have passed through the filter unit 20. Atoms (molecules) contained in the sample gas 9 are scanned by the filter unit 20 in a predetermined range of atomic mass units (amu), and by determining the ion intensity in the scanned range using the detector unit 30, it is possible to quantitatively measure the atoms (molecules) contained in the sample gas 9. This means that the monitor control unit 51 can output (display) the gas components and respective concentrations contained in the sample gas 9 as a measurement result or monitoring result. The monitor control unit 51 includes a unit (function) 55 that displays or outputs these measurement results (or monitoring results).

In the processing chamber 71, plasma processes are carried out and the sample gas 9 is supplied therefrom to the gas analyzer apparatus 1, and the process control unit 75 of the processing apparatus 70 performs control over at least one plasma process carried out in the processing chamber 71 based on the measurement result provided by the gas analyzer apparatus 1. The process control unit 75 includes a function (endpoint control unit) 76 for determining the endpoint of the at least one plasma process based on measurement results of by-products of the at least one plasma process produced by the gas analyzer apparatus 1.

The process control unit 75 also includes a function 74a of controlling an etching process (etching control unit), a function 74b of controlling a deposition (film forming) process (film forming control unit, deposition control unit), and a function 74c of controlling a cleaning process (cleaning control unit), with the respective end points of these processes being controlled by the endpoint control unit (endpoint control function) 76. The process control unit 75 may be equipped with computer resources including memory and a CPU, and the functions of the process control unit 75 may be provided by a program 79. The program (program product) 79 may be provided having been recorded on a suitable recording medium.

When processing a semiconductor substrate 78, for example, the etching control unit 74a introduces an etching gas, such as carbon fluoride CFx, sulfur hexafluoride $SF_6$, nitrogen trifluoride $NF_3$, or silicon tetrafluoride $SiF_4$ into the processing chamber 71 and generates process plasma to etch the substrate 78. The endpoint of the etching process can be determined by the endpoint control unit 76 from measurement results of the gas analyzer apparatus 1 for the concentration in the sample gas 9 of a component of the layer to be etched, for example, silicon oxide $SiO_2$, which is a by-product of the etching process. For this particular process, the concentration of $SiO_2$, which is a by-product, is related to the area that has been etched, as one example in a proportional relationship, which makes it possible to accurately determine that the etching of a region with a predetermined depth and/or width has been completed. In particular, by monitoring the etching process by using the gas analyzer apparatus 1 that has high corrosion resistance, control over the process can be carried out stably and accurately.

With the gas analyzer apparatus 1, it is possible to measure the components of the etching gas as well as the by-products. Accordingly, the process monitor 50 can monitor the state of a process using a plurality of monitoring criteria, including monitoring of the state of the etching gas and monitoring of an endpoint. The etching control unit 74a may include a model (artificial intelligence, AI) that has been machine-learned to control the progress of an etching process based on a plurality of monitoring criteria obtained from the process monitor 50. The same also applies to the other forms of process control described below.

For a substrate 78 on which an endpoint layer is provided, the endpoint control unit 76 may determine the endpoint of the etching process from the process monitor 50 detecting components of the endpoint layer as by-products. However, the method of detecting an endpoint is not limited to the methods described above. In the monitoring of endpoints using a conventional plasma process monitor, an endpoint is detected by optically determining the state of the plasma inside the processing chamber 71. On the other hand, the monitoring of endpoints using the gas analyzer apparatus 1 may include real-time monitoring of the concentration of actual by-products performed via plasma that is generated separately to the process plasma, which makes it possible to determine endpoints more accurately.

For a film forming (deposition) process that uses the film forming control unit 74b, it is possible to determine an endpoint by detecting by-products generated by the plasma used for deposition. In a deposition process (film formation process, film forming process), as examples, TEOS plasma (tetraethyl orthosilicate or tetraethoxysilane) is generated when depositing a $SiO_2$ layer on a semiconductor substrate 78 in the processing chamber 71, and plasma containing silane $SiH_4$ and ammonia $NH_3$ is generated when depositing a silicon nitride SiNx layer. At the endpoint control unit 76, the endpoint of the deposition process can be determined from the measurement results of the gas analyzer apparatus 1 for the concentration in the sample gas 9 of by-products of the deposition process, for example, hydrides (moisture), hydrocarbons, and carbon oxides.

In the case of a film forming process, the concentration of by-products is related, as one example in a proportional relationship, to the area and/or thickness that has been deposited, so that it is possible to accurately determine that the formation of a film with a predetermined area or thickness has been completed. At the same time, in the same way as the etching control described above, it is possible to monitor the state of the process plasma during the film forming process with the process monitor 50 and possible to control the film forming process according to AI using the monitoring result provided by the process monitor 50. Also, by monitoring the process using the gas analyzer apparatus 1 that is hardly affected by coatings and the like, it is possible to control the film forming or deposition process stably and accurately.

In a cleaning process that uses the cleaning control unit 74c, it is possible to determine the endpoint from by-products generated by the cleaning plasma. When performing cleaning after the formation of an $SiO_2$ layer in the processing chamber 71, cleaning plasma containing a corrosive gas, such as nitrogen trifluoride $NF_3$, is generated. The endpoint of the cleaning process can be determined by the gas analyzer apparatus 1 accurately detecting silicon tetrafluoride $SiF_4$, which is a by-product of the cleaning plasma in this example, via the sample gas 9 in real time.

Figure 3:
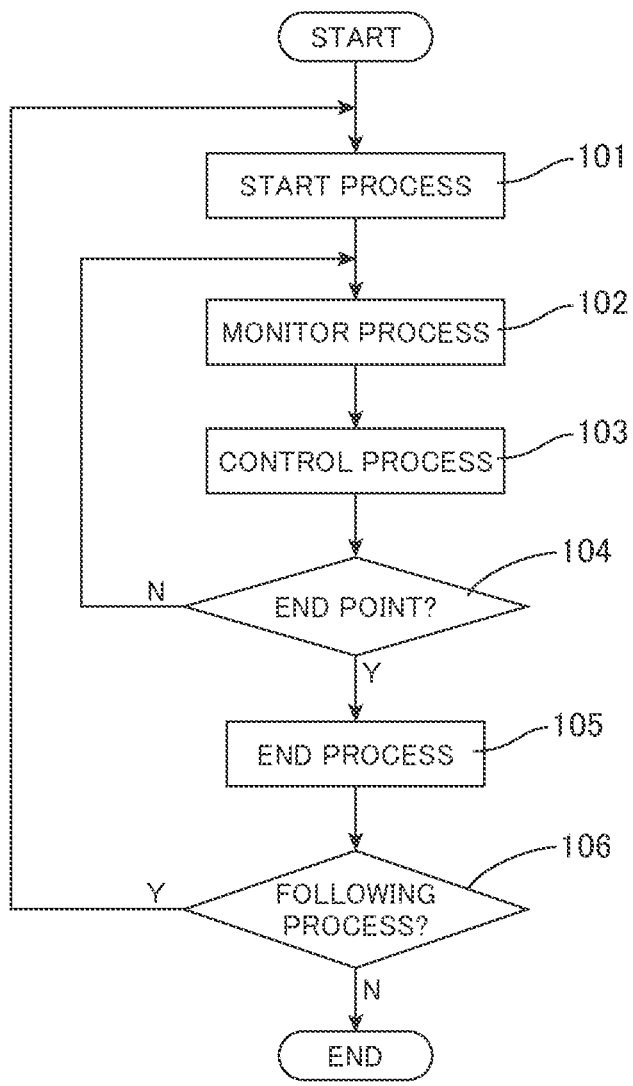
FIG. 3 is a flowchart depicting an example of control of a system.

FIG. 3 depicts, by way of a flowchart, one example of control of a system 80 that includes the process monitor 50 equipped with the gas analyzer apparatus 1 according to the present embodiment. In step 101, a plasma process is commenced by the processing apparatus 70. In step 102, the gas analyzer apparatus 1 connected to (fluidly communicated with) the processing chamber 71 performs monitoring, and in step 103, the plasma process carried out in the processing chamber 71 is controlled based on the measurement results of the gas analyzer apparatus 1. In this procedure, when the end point of the plasma process being carried out has been reached or discovered in step 104 from the measurement results of by-products of the plasma process provided by the gas analyzer apparatus 1, the plasma process is terminated in step 105. In step 106, if a following plasma process is required in the manufacturing or processing procedure of the workpiece, such as a semiconductor substrate, of the processing apparatus 70, the processing returns to step 101 to start the next plasma process. With a manufacturing method or a processing method that includes this type of control method, it is possible to manufacture and provide high-quality products in a minimum processing time using the processing apparatus 70.

Figure 4:
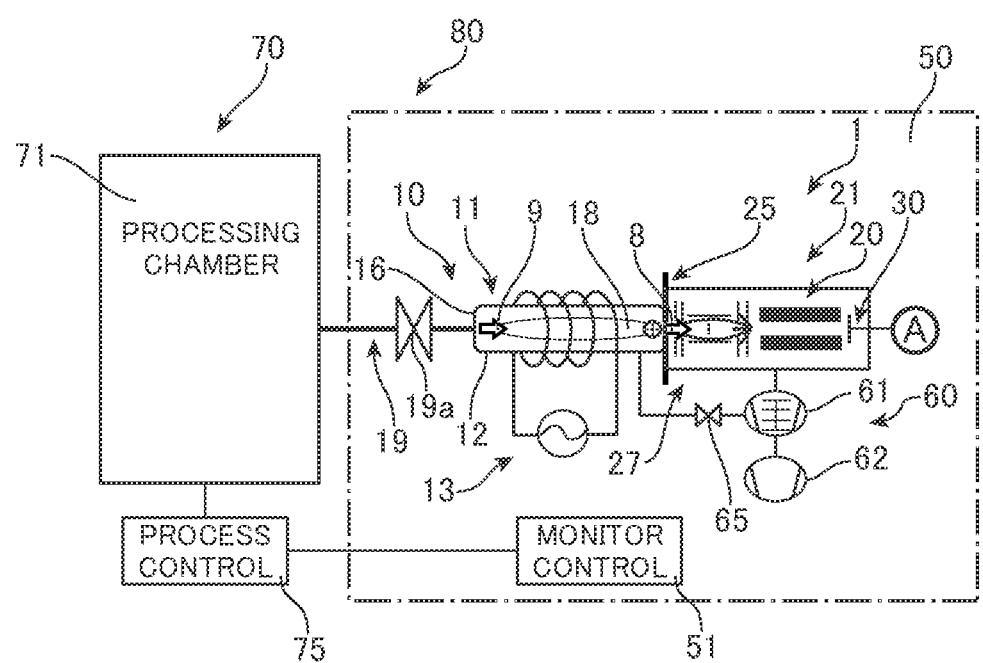
FIG. 4 is a diagram depicting another example of a mass spectrometer apparatus that performs plasma ionization.

FIG. 4 depicts another example of an embodiment of the present invention. The basic configuration of this system 80 is the same as the system 80 depicted in FIG. 2. The gas analyzer apparatus 1 includes a plasma generation unit 10. The gas analyzer apparatus 1 further includes an energy filter 27 between the plasma generation unit 10 and the filter unit (in the present embodiment, a quadrupole unit) 20. Although a Bessel-Box type energy filter (energy analyzer) is used in the present embodiment, a CMA (Cylindrical Mirror Analyzer) may be used. The energy filter 27 is composed of a cylindrical electrode, a disk-shaped electrode (with the same potential as the cylindrical electrode) that is disposed at the center of the cylindrical electrode, and electrodes disposed at both ends of the cylindrical electrode, and operates as a band pass filter that passes only ions having a specific kinetic energy using an electric field produced by the potential difference Vba between the cylindrical electrode and the electrodes at both ends and the potential Vbe of the cylindrical electrode. Soft X-rays generated during the generation of plasma and light generated during gas ionization can be prevented from becoming incident on the ion detector (detector) 30 by the disk-shaped electrode disposed in the center of the cylindrical electrode, which makes it possible to reduce noise. With this structure, ions and neutral particles that are generated inside and outside the ion generation unit and are parallel to the central axis are not detected.

In the plasma generation unit 10 that generates plasma at a lower voltage than the process, it is not necessary to introduce a support gas, such as argon plasma, which makes it possible to accurately perform quantitative analysis of the sample gas collected from the process. It is also possible to generate plasma continuously instead of generating plasma through pulse discharge using electrodes, and to suppress fluctuations due to the duty ratio of pulses or the like, which further reduces noise and improves the accuracy of the analysis. In addition, by using direct ionization, it is possible to lower the ionization current and suppress the production of fragments.

By operating the plasma generation unit 10 at a low pressure, it is possible to prevent highly reactive components from flowing into the ionization unit and via the ionization unit into the gas analyzer apparatus (mass spectrometer apparatus) 1, which extends the measurement life, including analysis of the sample gas 9 which includes components that are highly corrosive. In addition, since negative ions are formed in addition to positive ions during plasma ionization, it is possible to filter both positive and negative ions to detect components in the gas and thereby perform more accurate analysis. Since the sample gas 9 is in a state of being confined within the sample chamber 11 when the sample gas 9 is ionized, it is possible to increase the ionization area and to improve the ionization efficiency. In addition to this, a large amount of plasma radicals will be supplied to the chamber 11 and the gas analyzer apparatus 1, which suppresses the deposition of oxides and the like.

When many parts of the gas analyzer apparatus 1 including the housing 40 are made of an Fe—Ni material, in the worst case, components such as HF, HCl, $WF_x$, $WCl_x$ and the like may react with the Fe—Ni material and disappear. Although it is possible to perform cleaning by drawing plasma produced from a highly corrosive gas, such as $CF_x$, into the gas analyzer apparatus 1 as cleaning plasma, if many components of the gas analyzer apparatus 1 are made of metal, the metal may corrode, which would shorten the life of the gas analyzer apparatus 1. For this reason, for the components that construct the gas analyzer apparatus 1, it is effective to attach or coat with pyrolytic carbon (or pyrolytic graphite (PG)), in place of metal or on metal surfaces.

Note that although a quadrupole-type mass spectrometer has been described above as an example, the filter unit 20 may be an ion trap or another type of filter, such as a Wien filter. The filter unit 20 is not limited to a mass spectrometry-type, and may be a filter that filters molecules or atoms of a gas using other physical quantities, such as ion mobility. The gas analyzer unit may be an optical analyzer apparatus, such as a light-emitting analyzer unit.

Although specific embodiments of the present invention have been described above, various other embodiments and modifications will be conceivable to those of skill in the art without departing from the scope and spirit of the invention. Such other embodiments and modifications are addressed by the scope of the patent claims given below, and the present invention is defined by the scope of these patent claims.

The invention claimed is:

1. A processing system comprising:
    a processing chamber in which at least one plasma process is carried out;
    a gas analyzer to which a sample gas is supplied from the processing chamber; and
    a process controller that controls the at least one plasma process carried out in the processing chamber based on a measurement result of the gas analyzer, wherein the process controller includes a model that has been machine-learned to control the at least one plasma process based on monitoring results of the gas analyzer.

2. The processing system according to claim 1, wherein the at least one plasma process includes a process for manufacturing a product.

3. The processing system according to claim 2, wherein the model has been machined learned to control the at least one plasma process for manufacturing the product based on the monitoring results that include at least one of components of a processing gas and components of a by-product.

4. The processing system according to claim 1, further comprising:
    a gas inlet path that is configured to introduce only a gas from the processing chamber to the gas analyzer as the sample gas, and
    an exhaust system for evacuating the sample gas through the gas analyzer.

5. The processing system according to claim 4, wherein the gas inlet path includes a flow control means configured to control a flow of the sample gas from the processing chamber to the gas analyzer.

6. The processing system according to claim 2,
    wherein the at least one plasma process for manufacturing the product includes at least one of a chemical vapor deposition (CVD) and a physical vapor deposition (PVD).

7. The processing system according to claim 2,
    wherein the at least one plasma process for manufacturing the product includes at least one of forming a type of film on, forming a layer on, and etching a substrate.

8. The processing system according to claim 2,
    wherein the at least one plasma process for manufacturing the product includes at least one process for manufacturing semiconductors.

9. The processing system according to claim 2,
    wherein the at least one plasma process for manufacturing the product includes at least one process for manufacturing optical components.

* * * * *